(12) United States Patent
Anastasiadis et al.

(10) Patent No.: US 11,391,557 B2
(45) Date of Patent: Jul. 19, 2022

(54) MAGNETIC ANGULAR POSITION SENSOR CIRCUIT

(71) Applicant: Hamlin Electronics (Suzhou) Co. Ltd, Suzhou (CN)

(72) Inventors: Ioannis Anastasiadis, Norwich (GB); Ming Li, Suzhou (CN); Jiao Yu, Suzhou (CN)

(73) Assignee: Suzhou Littelfuse OVS Co., Ltd., Suzhou (CN)

(*) Notice: Subject to any disclaimer, the term of this patent is extended or adjusted under 35 U.S.C. 154(b) by 631 days.

(21) Appl. No.: 16/322,858

(22) PCT Filed: Aug. 5, 2016

(86) PCT No.: PCT/CN2016/093497
§ 371 (c)(1),
(2) Date: Feb. 1, 2019

(87) PCT Pub. No.: WO2018/023693
PCT Pub. Date: Feb. 8, 2018

(65) Prior Publication Data
US 2021/0333086 A1    Oct. 28, 2021

(51) Int. Cl.
G01B 7/14    (2006.01)
G01B 7/30    (2006.01)
G01D 5/14    (2006.01)

(52) U.S. Cl.
CPC .............. *G01B 7/30* (2013.01); *G01D 5/145* (2013.01)

(58) Field of Classification Search
CPC .......... G01D 5/145; G01B 7/30; G01B 7/023; G01R 33/07
See application file for complete search history.

(56) References Cited

U.S. PATENT DOCUMENTS

| | | | |
|---|---|---|---|
| 5,811,968 A | 9/1998 | Nakazawa et al. | |
| 5,818,223 A * | 10/1998 | Wolf | F02D 41/2432 |
| | | | 324/207.12 |
| 6,124,710 A | 9/2000 | Kordecki | |
| 9,239,248 B2 | 1/2016 | Zwijze et al. | |
| 2004/0222786 A1 | 11/2004 | Puech | |

(Continued)

FOREIGN PATENT DOCUMENTS

| | | |
|---|---|---|
| CN | 1517671 A | 8/2004 |
| CN | 1809725 A | 7/2006 |

(Continued)

OTHER PUBLICATIONS

Supplementary European Search Report dated Feb. 28, 2020 for European Patent Application No. 16911289.3.

(Continued)

*Primary Examiner* — Alesa Allgood
(74) *Attorney, Agent, or Firm* — KDB Firm PLLC

(57) ABSTRACT

Sensor arrangements are disclosed. A magnetic sensor is mounted to a printed circuit board. A pole element is arranged next to the magnetic sensor. The pole element acts as a magnetic field concentrator for the magnetic sensor. A movable magnet may be positioned in proximity to the magnetic sensor and the pole element. The movable magnet may be held in a magnet holding element. The magnet holding element may be attached to a rotatable element, such as a shaft.

9 Claims, 5 Drawing Sheets

(56) References Cited

U.S. PATENT DOCUMENTS

2007/0029996 A1* 2/2007 Spellman ............... G01D 5/147
　　　　　　　　　　　　　　　　　　　　324/207.2
2010/0176802 A1* 7/2010 Huguet ............... H04M 1/0264
　　　　　　　　　　　　　　　　　　　　324/207.25

FOREIGN PATENT DOCUMENTS

| CN | 201830313 U | 5/2011 |
| CN | 102435212 A | 5/2012 |
| CN | 102472642 A | 5/2012 |
| CN | 102788997 A | 11/2012 |
| CN | 103673870 A | 3/2014 |
| CN | 104583727 A | 4/2015 |
| CN | 204731676 U | 10/2015 |

OTHER PUBLICATIONS

Written Opinion from PCT/CN2016/093497 dated May 12, 2017, 3 pages.
International Search Report from from PCT/CN2016/093497 dated May 12, 2017, 3 pages.

* cited by examiner

MAGNETIC ANGULAR POSITION SENSOR CIRCUIT

BACKGROUND

Field

The present disclosure relates generally to sensor circuits. More specifically, the present disclosure relates to magnetic angular position sensor circuits.

Description of Related Art

The use of electronics in vehicles is increasing on an ongoing basis. For example, angular position sensors may be used in vehicles for sensing the rotational positions of shafts, axles, vane-throttles, etc.

An angular position sensor that is commonly used in automotive applications is a magnetic effect sensor. Magnetic field effect sensors use a magnetic induction element to detect magnetic field variation, which is then converted into electrical signal output corresponding to the angular position of a component (e.g., a shaft, an axel, etc.). Such magnetic angular position sensors rely on a varying air gap to vary a magnetic flux density applied to the magnetic effect sensor in response to angular motion. However, the varying air gap of such sensors causes the output signal of the sensor to be exponential and thus relatively non-linear. In order to linearize the response, the magnets utilized with such sensors have been known to be formed from irregular shapes. However, such irregular shaped magnets are known to be expensive to manufacture and thus increase the cost of commonly used angular position sensors.

It is with respect to these and other considerations that the present improvements may be useful.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

Sensor arrangements are disclosed. In one implementation, a magnetic sensor (e.g., Hall-effect sensor or magnetoresistive sensor) is mounted to a printed circuit board. Furthermore, a pole element is arranged next to the magnetic sensor. In a specific implementation, the pole element is arranged directly adjacent to the magnetic sensor. The pole element acts as a magnetic field concentrator for the magnetic sensor. Specifically, the pole element is to concentrate or focus a magnetic field that is receivable by the magnetic sensor. In one implementation, a movable magnet may be positioned in proximity to the magnetic sensor and the pole element. The movable magnet may be held in a magnet holding element. The magnet holding element may be attached to a rotatable element, such as a shaft. The moveable magnet may have a cuboid shape.

DETAILED DESCRIPTION

Figure 1:
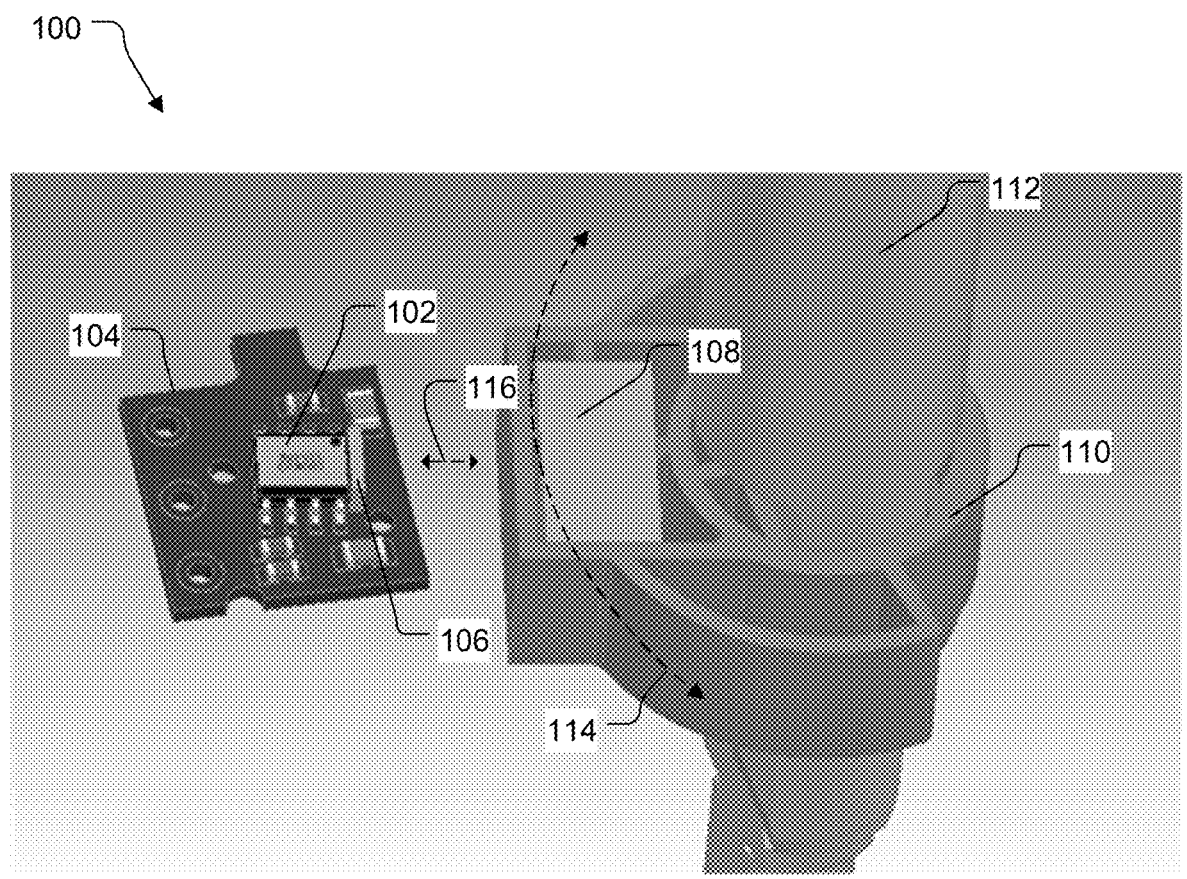
FIG. 1 illustrates an exemplary sensor arrangement.

FIG. 1 illustrates an exemplary sensor arrangement 100. The exemplary sensor arrangement 100 may include a magnetic sensor 102 (e.g., Hall-effect sensor or magnetoresistive sensor) mounted to a printed circuit board 104. Furthermore, a pole element 106 may be arranged next to the magnetic sensor 102. In one example, the pole element 106 is arranged near or directly adjacent to the magnetic sensor 102. The pole element 106 may be made of ferromagnetic material. For example, the pole element 106 may be made of steel (e.g, low-carbon steel AISI 1010), iron, nickel, cobalt, or the like.

The sensor arrangement 100 may further include a movable magnet 108. The movable magnet 108 may be positioned proximate to the magnetic sensor 102. In one implementation, the movable magnet 108 is held or positioned in a magnet holding element 110. The magnet holding element 110 may be coupled to a shaft 112. In one implementation, the magnet holding element 110 is coupled to the shaft 112, which is associated with a vane-throttle in a vehicle, such as an automobile. Movement of the shaft 112 along its axis will cause the magnet holding element 110 and the associated movable magnet 108 to rotate in an arc. The arc of rotation is shown by line 114.

In one implementation, the movable magnet 108 has a cuboid shape. Using a magnet having a cuboid shape, rather than an irregular shape (e.g., an arched or round shape), provides for a sensor arrangement 100 that is relatively inexpensive to manufacture.

Rotation of the movable magnet 108 may be sensed by the magnetic sensor 102. The magnetic sensor 102 may output a value proportional to the rotation of the movable magnet 108. More specifically, as the movable magnet 108 is rotated, its magnetic field distribution and an air-gap 116 (i.e., the distance between the movable magnet 108 and the magnetic sensor 102) change. The radial and axial components of the magnetic field are in phase sinusoidal distributed, whereas the normal magnetic distribution (i.e., a third magnetic component normal to the plane created by radial and axially components of the magnetic field) has a phase-shift of 90 degrees. These distributions are detected by the magnetic sensor 102 and processed in logic associated with the magnetic sensor 102. The output of the magnetic sensor 102 is a radiometric output correlating a detected rotation of the moveable magnet 108 to an output voltage.

In one implementation, the magnetic sensor 102 is a Hall-effect magnetic field orientation sensor MLX90360 from Melexis Microelectronic Integrated Systems NV.

The pole element 106 may function as a concentrator for the magnetic field associated with the moveable magnet 108. Specifically, the pole element 106 may function to attract and focus or concentrate the magnetic field generated by the movable magnet 108. The focused or concentrated magnetic field is guided to the magnetic sensor 102 by the pole element 106.

Figure 2:
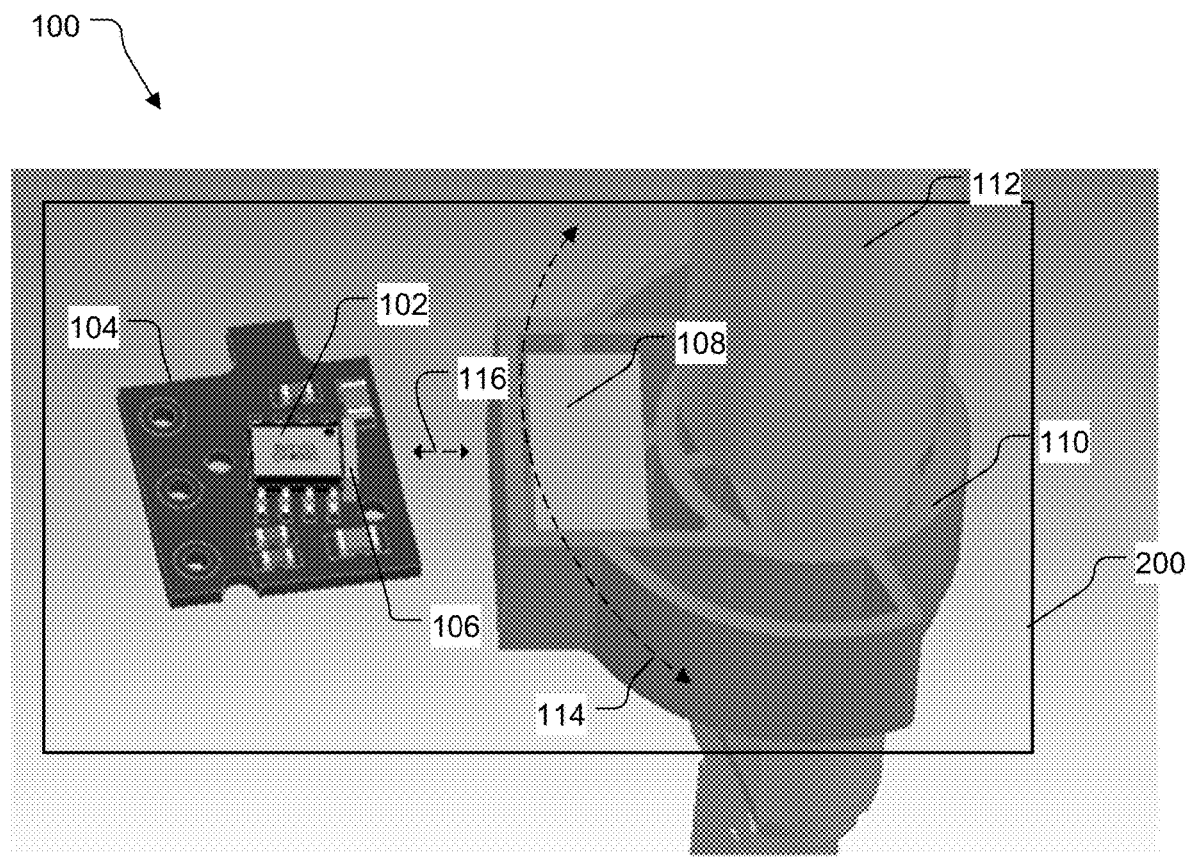
FIG. 2 illustrates the exemplary sensor arrangement disposed within a housing.

FIG. 2 illustrates the exemplary sensor arrangement 100 disposed within a housing 200. In one implementation, the magnetic sensor 102 mounted to the printed circuit board 104 and the pole element 106 are held firmly in place within the housing 200. Conversely, the movable magnet 108 held by the magnet holding element 110 is rotatable within the housing 200.

Figure 3:
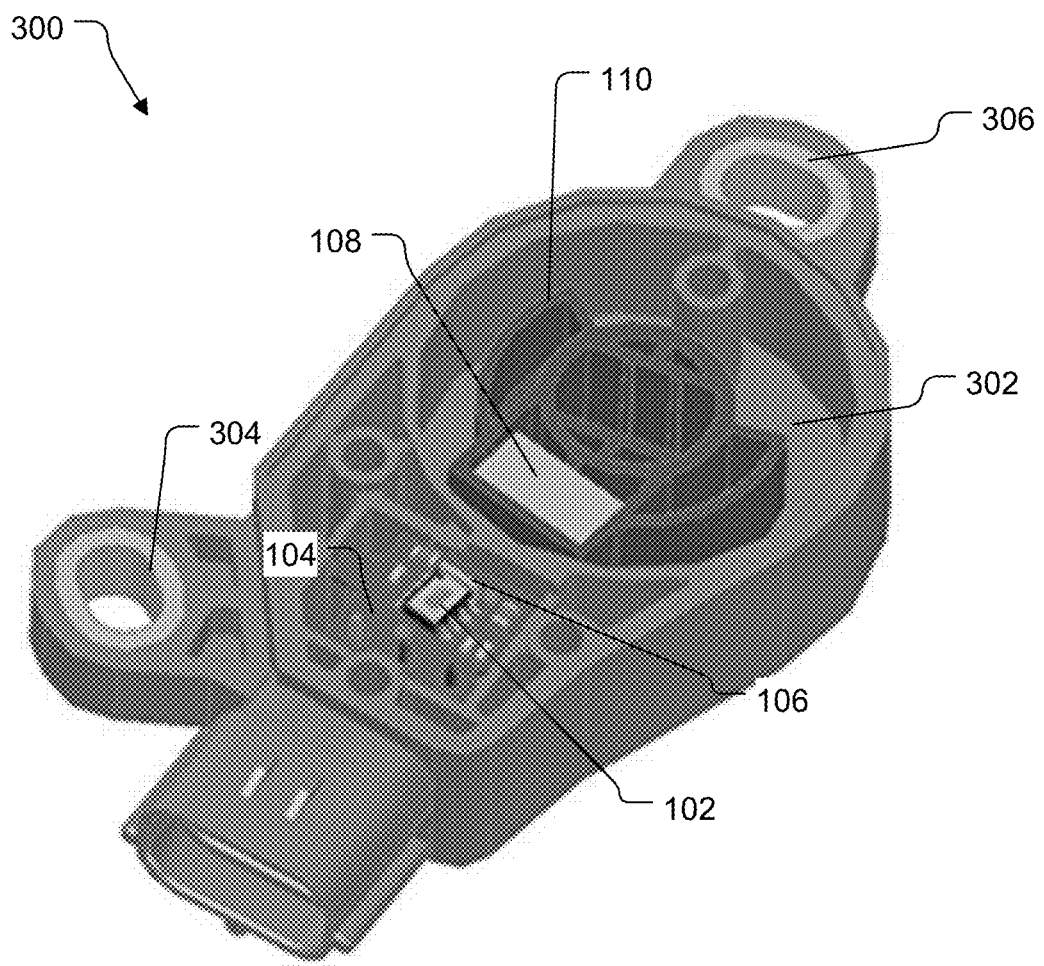
FIG. 3 illustrates an exemplary housing for a sensor arrangement.

FIG. 3 illustrates an exemplary housing 300 for the sensor arrangement 100. The exemplary housing 300 may be used for the housing 200 illustrated in FIG. 2. As shown in FIG. 3, the printed circuit board 104, including the magnetic sensor 102 and the pole element 106, is held firmly in place within the housing 300. The magnet holding element 110 including the movable magnet 108 may be disposed in an opening 302 of the housing 300. The magnet holding element 110 may rotate within the opening 302. Mounting bodies 304 and 306 are provided on the housing 300. The mounting bodies at 304 and 306 enable the housing 300 to be fixedly mounted to a vehicle, such as an automobile.

Figure 4:
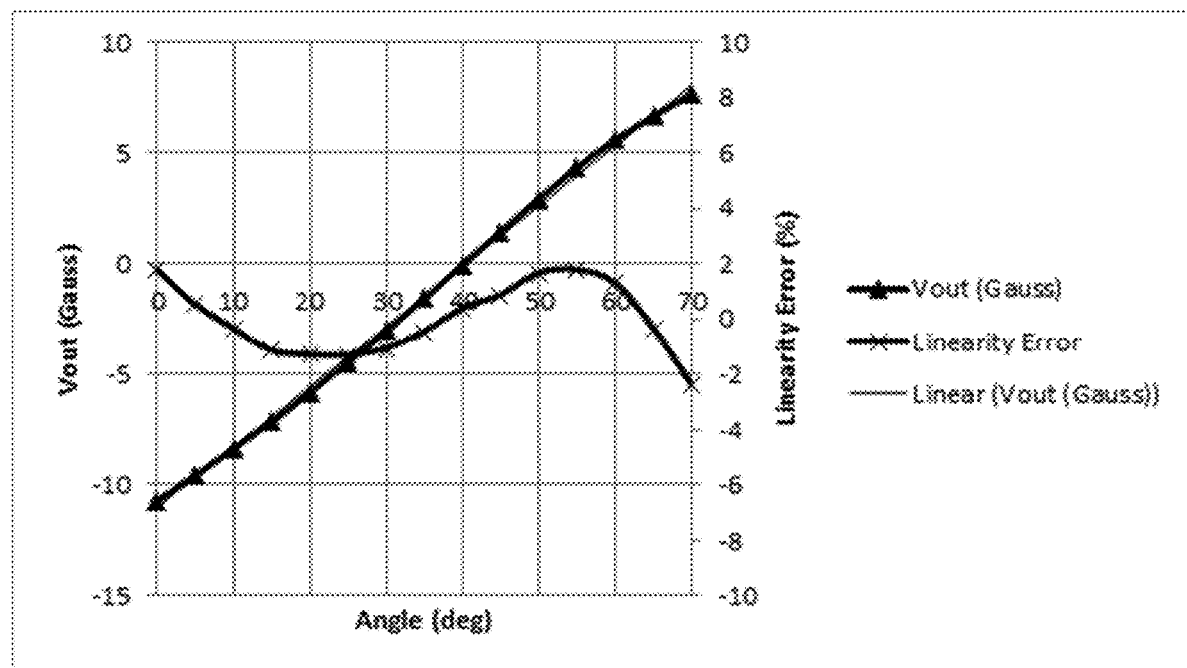
FIG. 4 is a graph that depicts an output of the sensor arrangement.

FIG. 4 is a graph depicting an output of the sensor arrangement 100, based on a magnetic field distribution of the moveable magnet 108 through 70 degrees of rotation. At least the use of the pole element 106 enables the sensor arrangement 100 to realize a linearity error that is less than 2%. Further linearity compensation may be achievable through internal functionality of the magnetic sensor 102.

Figure 5:
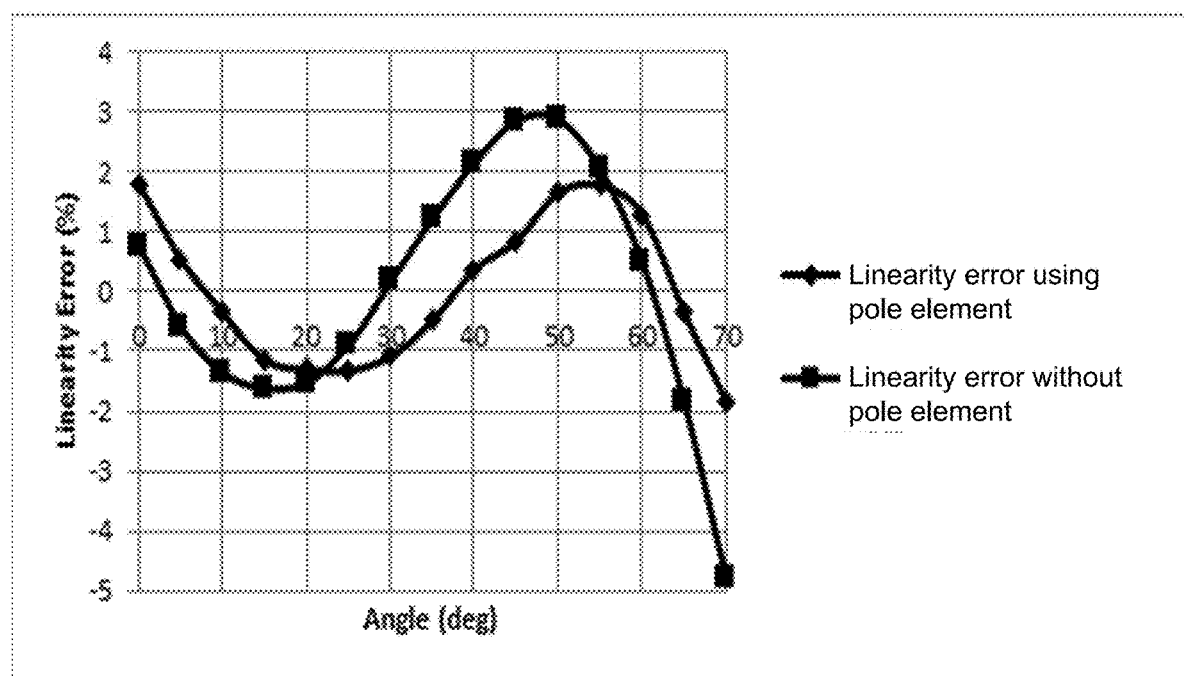
FIG. 5 is a graph depicting linearity error without the use of a pole element and with the use of a pole element.

FIG. 5 is a graph depicting linearity error without the use of the pole element 106 and with the use of the pole element 106. As illustrated, at least one sensor arrangement that does not use a pole element has higher linearly error compared to the linearity error of the sensor arraignment 100.

While exemplary sensor arrangements are disclosed, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

We claim:

1. A sensor arrangement, comprising:
   a magnetic sensor to receive a magnetic field;
   a pole element arranged next to the magnetic sensor, the pole element to concentrate the magnetic field receivable by the magnetic sensor; and
   a movable magnet positioned proximate to the magnetic sensor and the pole element and disposed within a magnet holding element, wherein the magnet holding element is attached to a rotatable member, wherein rotation of the rotatable member changes a size of an air gap between the movable magnet and the magnetic sensor;
   wherein the movable magnet is movable along a path that extends between the magnetic sensor and an axis about which the movable magnet rotates.

2. The sensor arrangement according to claim 1, wherein the pole element is arranged directly adjacent to the magnetic sensor.

3. The sensor arrangement according to claim 1, wherein the movable magnet has a cuboid shape.

4. The sensor arrangement according to claim 1, further comprising a housing, and wherein the magnetic sensor and the pole element are mounted to a printed circuit board, the printed circuit board disposed in the housing.

5. The sensor arrangement according to claim 1, wherein the magnetic sensor is a Hall-effect sensor.

6. The sensor arrangement according to claim 1, wherein the magnetic sensor is mounted to a printed circuit board.

7. The sensor arrangement according to claim 6, wherein the pole element is mounted to the printed circuit board, the pole element mounted directly adjacent to the magnetic sensor mounted to the printed circuit board.

8. The sensor arrangement according to claim 1, wherein the pole element is made of ferromagnetic material.

9. The sensor arrangement according to claim 8, wherein the ferromagnetic material is steel.

\* \* \* \* \*